United States Patent
Edwards et al.

(10) Patent No.: US 10,468,359 B2
(45) Date of Patent: *Nov. 5, 2019

(54) PACKAGE STIFFENER FOR PROTECTING SEMICONDUCTOR DIE

(71) Applicant: Google LLC, Mountain View, CA (US)

(72) Inventors: William Edwards, Mountain View, CA (US); Erick Tuttle, Morgan Hill, CA (US); Madhusudan Krishnan Iyengar, Foster City, CA (US); Yuan Li, Sunnyvale, CA (US); Jorge Padilla, Union City, CA (US); Woon-Seong Kwon, Santa Clara, CA (US); TeckGyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/110,133

(22) Filed: Aug. 23, 2018

(65) Prior Publication Data

US 2019/0237411 A1 Aug. 1, 2019

Related U.S. Application Data

(63) Continuation of application No. 15/886,246, filed on Feb. 1, 2018, now Pat. No. 10,083,920.

(51) Int. Cl.
*H05K 7/10* (2006.01)
*H05K 7/12* (2006.01)
(Continued)

(52) U.S. Cl.
CPC ............ *H01L 23/562* (2013.01); *H01L 23/50* (2013.01); *H05K 5/0026* (2013.01); *H05K 5/0217* (2013.01)

(58) Field of Classification Search
CPC ....... H01L 23/04; H01L 23/50; H01L 23/562; H05K 5/0026; H05K 5/0217
See application file for complete search history.

(56) References Cited

U.S. PATENT DOCUMENTS 6,046,077 A 4/2000 Baba
6,288,900 B1 9/2001 Johnson
(Continued)

FOREIGN PATENT DOCUMENTS

WO WO 2011117726 9/2011

OTHER PUBLICATIONS

'www.altera.com' [online] "Thermal Management and Mechanical Handling for Lidless Flip Chip Ball-Grid Array," Application Note AN-659 1.2, Jun. 2016 [Retrieved Feb. 1, 2018] Retrieved from Internet URL< https://www.altera.com/en_US/podfs/literature/an/an659.podf> 14 pages.

(Continued)

*Primary Examiner* — Yuriy Semenenko
(74) *Attorney, Agent, or Firm* — Fish & Richardson P.C.

(57) ABSTRACT

The subject matter of this specification generally relates to electronic packages. In some implementations, a lidless electronic package includes a substrate having a surface and a die disposed on the surface of the substrate. The die has an outside perimeter, a bottom surface adjacent to the surface of the substrate, and a top surface. The electronic package includes a stiffener disposed on the surface of the substrate. The stiffener includes a first surface that is a first distance from the surface of the substrate and a second surface disposed between the die and the first surface. The first distance is greater than a distance between the surface of the substrate and the top surface of the die. The second surface is a second distance from the surface of the substrate that is (Continued)

less than the distance between the surface of the substrate and the top surface of the die.

18 Claims, 5 Drawing Sheets

(51) Int. Cl.
*H01L 23/00* (2006.01)
*H05K 5/02* (2006.01)
*H01L 23/50* (2006.01)
*H05K 5/00* (2006.01)

(56) References Cited

U.S. PATENT DOCUMENTS

| | | | |
|---|---|---|---|
| 6,316,829 B1 | 11/2001 | Boon et al. | |
| 7,030,484 B1 | 4/2006 | Zheng et al. | |
| 7,459,782 B1* | 12/2008 | Li | H01L 23/36 257/702 |
| 7,538,421 B2* | 5/2009 | Chen | H01L 23/16 257/704 |
| 7,883,937 B1* | 2/2011 | Kang | H01L 21/563 257/687 |
| 10,083,920 B1* | 9/2018 | Edwards | H01L 23/04 |
| 2005/0127484 A1 | 6/2005 | Wills | |
| 2007/0145571 A1* | 6/2007 | Lee | H01L 21/563 257/706 |
| 2008/0272482 A1 | 11/2008 | Jensen | |
| 2010/0025081 A1 | 2/2010 | Arai | |
| 2011/0235304 A1 | 9/2011 | Brown et al. | |
| 2011/0241161 A1 | 10/2011 | Tosaya et al. | |
| 2013/0105994 A1* | 5/2013 | Colgan | H01L 23/433 257/782 |
| 2013/0258619 A1 | 10/2013 | Ley | |
| 2014/0167243 A1 | 6/2014 | Shen | |
| 2015/0001701 A1 | 1/2015 | Li et al. | |
| 2016/0190073 A1* | 6/2016 | Chen | H01L 23/16 257/723 |
| 2017/0053845 A1 | 2/2017 | Interrante et al. | |
| 2017/0179043 A1* | 6/2017 | Xu | H01L 23/16 |
| 2018/0068917 A1* | 3/2018 | Iruvanti | H01L 23/10 |

OTHER PUBLICATIONS

'www.electronics-cooling.com' [online] "Lidded Versus Bare Die Flip Chip Package: Impact on Thermal Performance," by Jesse Galloway, No. 2, vol. 18, Jun. 21, 2012 [retrieved on Feb. 1, 2018] Retrieved from Internet: URL< https://www.electronics-cooling.com/2012/06/lidded-versus-bare-die-filp-chip-package-impact-on-thermal-performance/> 10 pages.

'www.nxp.com' [online] "Assembly Handling and Thermal Solutions for Lidless Flip Chip Ball Grid Array Packages," NXP Freescale Semiconductor Application No. Document No. AN4871, Feb. 2014 [retrieved Feb. 1, 2018] Retrieved from Internet: URL< https://www.nxp.com/docs/en/application-note/AN4871.pdf> 10 pages.

Bash et al. "Improving Heat Transfer from a Flip-Chip Package," Article 16, Hewlett-Packard Journal, Aug. 1997, 7 pages.

Prasad et al. "Comparison of lidless & overmold flip chip package with 40nm ultra low-k Silicon Technology," Proceedings of the 60the Electronic Components and Technology Conference, Jun. 2010, 5 pages.

PCT International Search Report and Written Opinion in International Application No. PCT/US2019/015551, dated Apr. 9, 2019, 17 pages.

\* cited by examiner

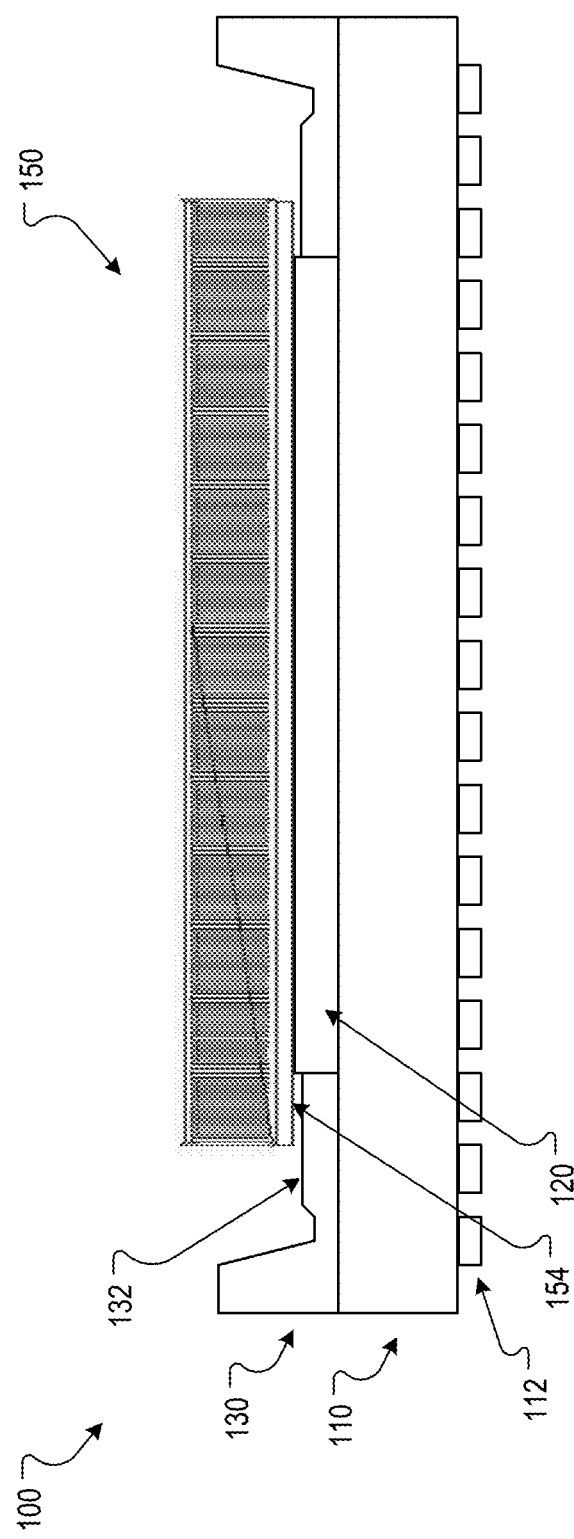

PACKAGE STIFFENER FOR PROTECTING SEMICONDUCTOR DIE

CROSS-REFERENCE TO RELATED APPLICATIONS

This application is a continuation application of, and claims priority to, U.S. patent application Ser. No. 15/886,246, titled "PACKAGE STIFFENER FOR PROTECTING SEMICONDUCTOR DIE," filed on Feb. 1, 2018. The disclosure of the foregoing application is incorporated herein by reference in its entirety for all purposes.

BACKGROUND

There are various ways to package an integrated circuit. A lidless electronic package is one that does not include a lid mounted to the die. A lidless electronic package allows a heat sink to directly contact the die, which allows for better thermal performance than electronic packages that include a lid. However, lidless electronic package designs suffer from increasing flatness problems as the packages grow in size. Increasing flatness problems can make package assembly difficult and result in lower yield.

SUMMARY

This specification describes lidless electronic packages having a multi-surface stiffener that protects the semiconductor die from damage and keeps the package flat.

In general, one innovative aspect of the subject matter described in this specification can be implemented in lidless electronic packages that include a substrate having a surface and a die disposed on the surface of the substrate. The die can have an outside perimeter, a bottom surface adjacent to the surface of the substrate, and a top surface opposite the bottom surface. The lidless electronic package can also include a stiffener disposed on the surface of the substrate and that encloses at least a portion of the outside perimeter of the die. The stiffener can include a first surface that is a first distance from the surface of the substrate. The first distance can be greater than a distance between the surface of the substrate and the top surface of the die. The stiffener can also include a second surface that is disposed between the die and the first surface. The second surface can be a second distance from the surface of the substrate. The second distance can be less than the distance between the surface of the substrate and the top surface of the die.

These and other implementations can each optionally include one or more of the following features. In some aspects, the first surface and the second surface are substantially parallel with the surface of the substrate. The first surface can be above the top surface of the die and the second surface can be below the top surface of the die. The second surface can be 0.02-0.06 millimeters closer to the surface of the substrate than the top surface of the die.

In some aspects, the stiffener includes a sloped surface that extends from the first surface to the second surface. The sloped surface can be at a less than ninety-degree angle with respect to the second surface. In some aspects, the stiffener includes a recessed groove between the first surface and the second surface. The recessed groove can include a third surface that is closer to the surface of the substrate than the second surface.

In some aspects, the stiffener includes a first stiffener with a first thickness that causes the second surface to be closer to the surface of the substrate than the top surface of the die and a second stiffener disposed on a portion of the first stiffener. The second stiffener can have a thickness that causes the second surface to be farther from the surface of the substrate than the top surface of the die.

In some aspects, the first surface and the second surface are part of a single stiffener that has a varying thickness. The thickness of the stiffener below the first surface can be greater than a thickness of the stiffener below the second surface.

In general, another innovative aspect of the subject matter described in this specification can be implemented in electronic packages that include a substrate having a surface and a die disposed on the surface of the substrate. The die can have an outside perimeter, a bottom surface adjacent to the surface of the substrate, and a top surface opposite the bottom surface. The electronic package can also include a stiffener disposed on the surface of the substrate and that encloses at least a portion of the outside perimeter of the die. The stiffener can include a first portion having a first surface and a first thickness extending between the surface of the substrate and the first surface. The first thickness can be greater than a thickness of the die. The stiffener can also include a second portion having (i) a second surface that is disposed between the die and the first surface and (ii) a second thickness extending between the surface of the substrate and the second surface. The second thickness can be less than the thickness of the die.

These and other implementations can each optionally include one or more of the following features. In some aspects, the first surface and the second surface are substantially parallel with the surface of the substrate. The first surface can be above the top surface of the die and the second surface can be below the top surface of the die. The die can be 0.02-0.06 millimeters thicker than the second portion.

In some aspects, the stiffener includes a sloped surface that extends from the first surface to the second surface. The sloped surface can be at a less than ninety-degree angle with respect to the second surface. In some aspects, the stiffener includes a recessed groove between the first surface and the second surface. The recessed groove can include a third surface that is closer to the surface of the substrate than the second surface.

In general, another innovative aspect of the subject matter described in this specification can be implemented in lidless electronic packages that include a substrate having a surface and a die attached to the surface of the substrate. The die can have an outside perimeter, a bottom surface adjacent to the surface of the substrate, and a top surface opposite the bottom surface. The lidless electronic package can also include a stiffener disposed on the surface of the substrate and that encloses the outside perimeter of the die. The stiffener can include a first surface that is farther from the surface of the substrate than the top surface of the die and a second surface that is disposed between the die and the first surface. The second surface can be closer to the surface of the substrate than the top surface of the die.

These and other implementations can each optionally include one or more of the following features. In some aspects, the first surface is above the top surface of the die and the second surface is below the top surface of the die. The second surface can be 0.02-0.06 millimeters closer to the surface of the substrate than the top surface of the die.

In some aspects, the stiffener includes a sloped surface that extends from the first surface to the second surface. The sloped surface can be at a less than ninety-degree angle with respect to the second surface.

In some aspects, the stiffener includes a recessed groove between the first surface and the second surface. The recessed groove can include a third surface that is closer to the surface of the substrate than the second surface.

In some aspects, the stiffener includes a first stiffener with a first thickness that causes the second surface to be closer to the surface of the substrate than the top surface of the die and a second stiffener disposed on a portion of the first stiffener. The second stiffener can have a thickness that causes the second surface to be farther from the surface of the substrate than the top surface of the die.

Particular aspects of the subject matter described in this specification can be implemented so as to realize one or more of the following advantages. An electronic package can include multiple surfaces (e.g., in a stepped arrangement) to prevent warping of the package while also protecting the semiconductor die from damage during heat sink installation. A first portion of the stiffener can be thicker and extend above a top surface of the die to provide better protection from warping. A second portion of the stiffener, which can be disposed between the die and the first portion of the stiffener, can have a surface that is below the top surface of the die. The second portion provides a landing shelf for the heat sink that prevents the heat sink from first contacting the die and damaging the die, e.g., if the heat sink approaches the die at an angle with respect to the top surface of the die. By having the surface of the second portion below the top surface of the die, the heat sink can also rest flat against the die, which provides better thermal contact between the heat sink and the die than if there was space between the heat sink and the die. This provides better heat transfer between the die and the heat sink. Thus, electronic packages described herein allow for larger stiffeners that provide better protection against warping while also protecting the die from damage that could result from having a stiffener that extends above the top surface of the die.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 1E is a cross-sectional view of the electronic package of FIG. 1A with a heat sink installed thereon.

Like reference numbers and designations in the various drawings indicate like elements.

DETAILED DESCRIPTION

An electronic package, which is also referred to an integrated circuit (IC) package, includes a substrate and one or more die disposed on a surface of the substrate. Each die can include integrated circuits fabricated on semiconducting material. An electronic package can also include one or more stiffeners that prevent the components of the electronic package from warping. For example, there are mismatches of coefficients of thermal expansion (CTE) in the different components of an electronic package. When the temperature changes, e.g., during the package assembly process, the CTE mismatch can cause the electronic package to warp, bend, or twist, resulting in a less flat electronic package. Flatness problems can make the soldering process more difficult, resulting in poor solder joints between the electronic package and a circuit board or other mounting surface.

A stiffener can prevent the electronic package from warping. A stiffener can be attached to the perimeter of the substrate, e.g., around the perimeter of the die. The stiffener can have a higher elastic modulus than the substrate to prevent the substrate from warping. In general, the protection against warping improves with an increase in the size of the stiffener, e.g., with an increase in the thickness of the stiffener. However, the size of the stiffener may be limited by the size of the substrate and characteristics of the package assembly process.

If the stiffener extends above the top surface of the die (i.e., the surface opposite the surface of the substrate), the stiffener can provide better protection against warping. However, this can make it more difficult to install the heat sink without damaging the die. For example, if the heat sink is installed at an angle, (e.g., not flat with respect to the top surface of the die), the heat sink can damage the die. In some cases, heat sinks are installed by people that may not be able to see how flat the heat sink is when the heat sink is approaching the die due to the geometry of the electronic package.

Stiffeners described herein have multiple surfaces and/or varying thicknesses that allow for a portion of the stiffener to extend above the top surface of the die, while also protecting the die from damage during the heat sink installation. For example, the stiffener can include a first surface that is above the top surface of the die and a second surface that is below the top surface of the die. The second surface can be disposed between the die and the first surface. In this way, the second surface can provide a landing shelf for the heat sink in case the heat sink approaches the die at an angle, while also allowing for a larger stiffener.

Figure 1A:
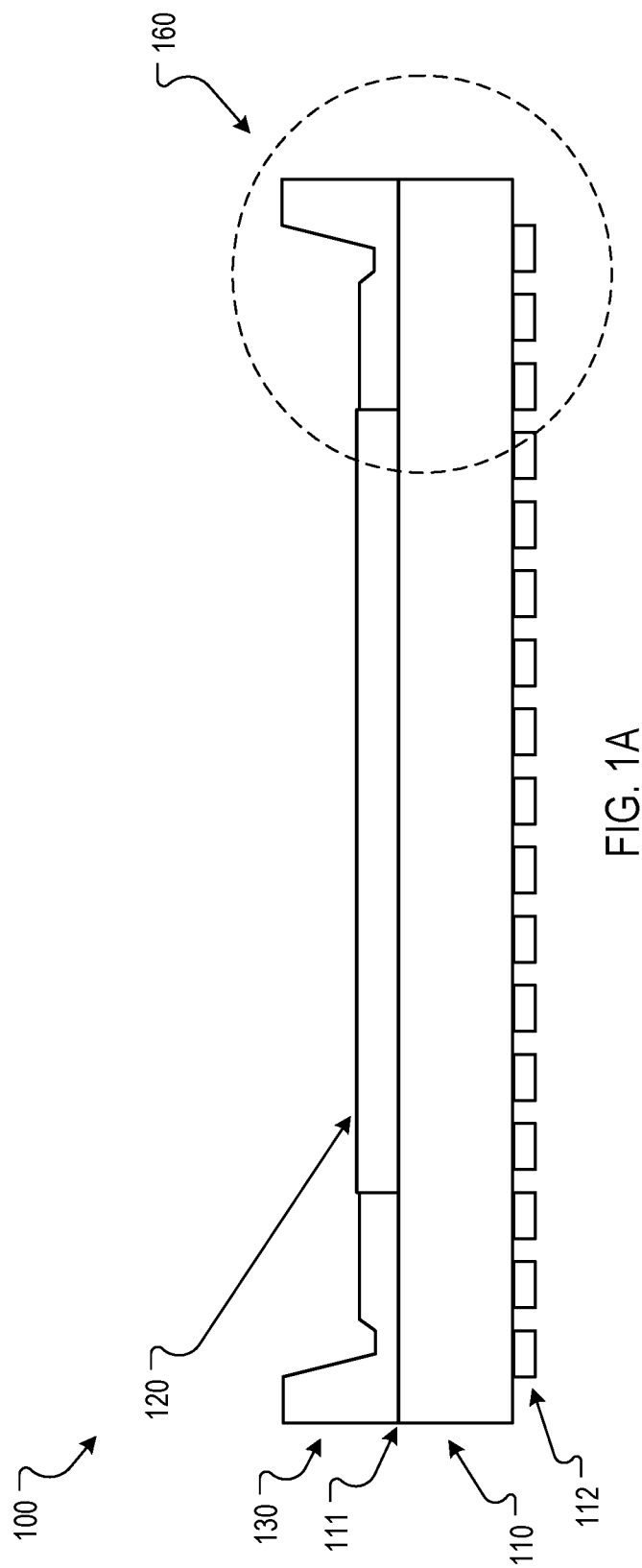
FIG. 1A is a cross-sectional view of an example electronic package.

FIGS. 1A-1E depict an example electronic package 100. The relative dimensions in each figure are illustrative only and not necessarily to scale. FIG. 1A is a cross-sectional view of the example electronic package 100. The electronic package 100 includes a substrate 110 and a die 120 disposed on (e.g., attached to) a surface 111 of the substrate 110. Although one die 120 is illustrated in FIG. 1A, multiple die can be disposed on the surface 111 of the substrate 110.

The electronic package 100 also includes interconnection pins for attaching the electronic package 100 to a mounting surface, e.g., to a printed circuit board. The electronic package 100 can be a lidless electronic package that does not include a lid over the die 120. For example, the electronic package 100 can be a lidless ball grid array (BGA) package.

The electronic package 100 also includes a stiffener 130 disposed on (e.g., attached to) the surface 111 of the substrate 110. In general, the stiffener 130 can be made of a material that has a higher elastic modulus than the elastic modulus of the substrate 110. For example, the stiffener 130 can be made of a metal (e.g., aluminum, copper, or steel), a ceramic, a composite material, or another appropriate material. The stiffener 130 can be a single stiffener structure or multiple stiffener structures coupled to one another, as described below with reference to FIG. 2.

Figure 1B:
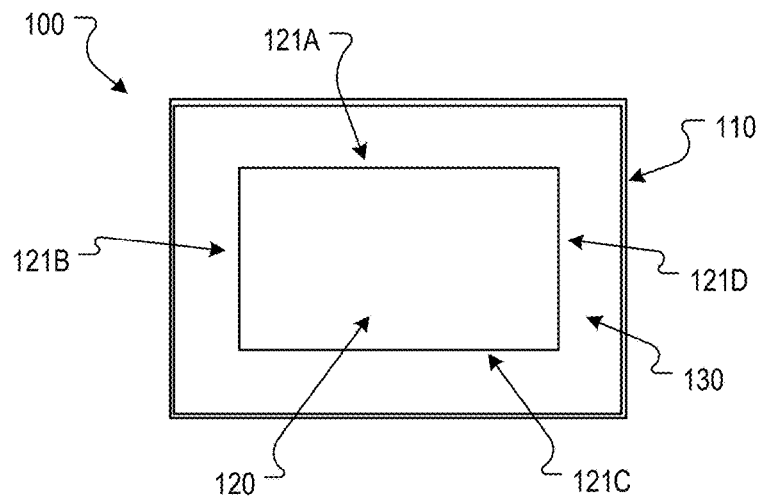
FIG. 1B is a top view of the example electronic package of FIG. 1A.

Referring to FIG. 1B, the stiffener 130 can enclose at least a portion of the outside perimeter of the die 120. The outside perimeter of the die 120 includes the four sides 121A-121D of the die 120. In this example, the stiffener 130 encloses the entire outside perimeter of the die 120. In some implementations, the stiffener 130 encloses only a portion of the outside perimeter of the die 120. For example, the stiffener 130 can be installed on one or more sides of the die 120, e.g., on two or three dies of the die 120. In another example, the stiffener 130 can substantially enclose the outside perimeter of the die 120 by having a respective stiffener on each side 121A-121C of the die 120, but some space between each adjacent stiffener.

In the example of FIGS. 1A-1E, the stiffener 130 is adjacent to each side 121A-121D of the die 120. For example, each side 121A-121D of the die 120 may contact a respective part of the stiffener 130. In some implementations, there is space between the stiffener 130 and the sides 121A-121D of the die 120.

Figure 1C:
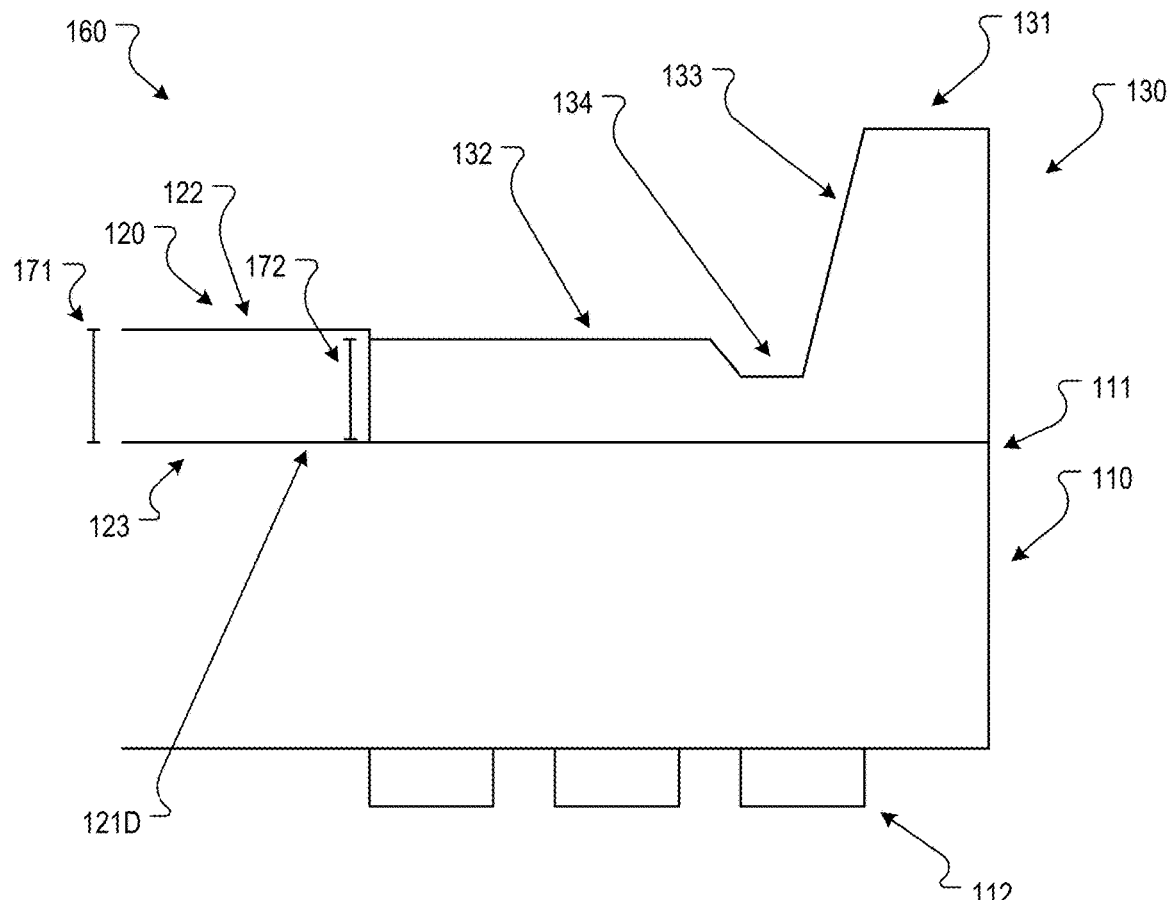
FIG. 1C is a partial cross-sectional view of the example electronic package of FIG. 1A.

FIG. 1C is a partial cross-sectional view of a portion 160 of the example electronic package of FIG. 1A. Referring to FIG. 1C, the stiffener 130 includes a first surface 131 and a second surface 132. The first surface 131 can be above the top surface 122 of the die 120, while the second surface is below the top surface 122 of the die 120. The top surface 122 of the die 120 is the surface of the die 120 opposite the surface 123 of the die 120 that is adjacent to the surface 111 of the substrate 110. The term "top surface" is used for ease of subsequent discussion, but the top surface 122 may not always be the top portion of the die 120 depending on the orientation of the electronic package 100. For example, if the electronic package it flipped, the top surface 122 would be below the surface 123.

The term "above" is used to refer to the first surface 131 being a greater distance away from the surface 111 of the substrate 110 than the distance between the top surface 122 of the die 120 and the surface 111 of the substrate 110. Similarly, the term "below" is used to refer to the second surface 132 being a shorter distance from the surface 111 of the substrate 110 than the distance between the top surface 122 of the die 120 and the surface 111 of the substrate 110. In different orientations of the electronic package 100, e.g., if the electronic package 100 is flipped upside down from the illustrated orientation, the first surface 131 may be at a lower altitude than the top surface 122 of the die 120. However, the first surface 131 will still be at a greater distance from the surface 111 of the substrate 110 than the distance between the top surface 122 of the die 120 and the surface 111 of the substrate 110.

The additional thickness of the stiffener 130 between the first surface 131 and the surface 111 of the substrate 110 provides better protection against warping, allowing the substrate to remain flatter. As used herein, thickness of a portion of the stiffener 130 represents the distance between the surface 111 of the substrate 110 and the surface of the portion of the stiffener 130 opposite the surface 111 of the substrate 110. The protection against warping improves with an increase in the thickness of the stiffener. In this example, the portion of the stiffener 130 between the first surface 131 and the surface 111 of the substrate 110 is thicker than the portion of the stiffener 130 between the second surface 132 and the surface 111 of the substrate 110.

The second surface 132 provides a landing shelf for a heat sink when the heat sink is being installed on the electronic package 100. As described in more detail below with reference to FIG. 1D, if the heat sink approaches the die 120 at an angle with respect to the top surface 122 of the die 120, the heat sink is more likely to make contact with a portion of the second surface 122 (e.g., on one side of the die 120) rather than the die 120 itself. This protects the die 120 from damage caused by the heat sink.

To provide the landing shelf, the second surface 132 is below the top surface 122 of the die 120. That is, the second surface 122 is a shorter distance from the surface 111 of the substrate 110 than the distance between the top surface 122 of the die 120 and the surface 111 of the substrate 110. As described below with reference to FIG. 1E, this allows the heat sink to rest flat against the die 120.

The second surface 132 of the stiffener can be close to the same distance from the surface 111 of the substrate 110 as the top surface 122 of the die 120. For example, the second surface 132 of the stiffener 130 can be 0.02-0.06 millimeters (mm) below the top surface 122 of the die 120. That is, the distance 171 between the surface 111 of the substrate 110 and the top surface 122 of the die 120 can be 0.02-0.06 mm longer than the distance 172 between the surface 111 of the substrate 110 and the second surface 132. The closer the second surface 132 of the stiffener 130 and the top surface 122 of the die 120 are to being the same distance from the surface 111 of the substrate 110, the more likely it is that the heat sink contacts a portion of the second surface 132 of the stiffener 130 prior to contacting the die 120. However, if the designed distance is too short, manufacturing defects can result in a second surface 132 that is above the top surface 122 of the die 120, resulting in reduced thermal contact between the heat sink and the die 120.

In some implementations, the first surface 131 of the stiffener 130 and the second surface 132 of the stiffener 130 are substantially parallel. That is, the surfaces 131 and 132 may be parallel or have less than a five-degree angle between the surfaces. Similarly, the surfaces 131 and 132 may be substantially parallel with the top surface 122 of the die 120.

The stiffener 130 also includes a lead-in draft 133 and a recessed groove 134. The lead-in draft 133 provides a sloped surface from the first surface 131 of the stiffener 130 towards the die 120. The lead-in draft 130 can help guide the heat sink towards the center of the electronic package 100 if the heat sink is approaching the die 120 near the first surface 131 of the stiffener 130. The slope of the lead-in draft 130 with respect to the first surface can be less than ninety degrees, i.e., not normal to the first surface 131.

The recessed groove 134 can help ensure that the heat sink rests flat against the die 120. For example, if the second surface 122 of the stiffener 130 extended to the lead-in draft 134, an end of the heat sink could rest on the lean-in draft 133. This would result in the heat sink being at a non-zero angle with respect to the top surface 122 of the die 120, resulting in less thermal contact between the heat sink and the die 120.

Figure 1D:
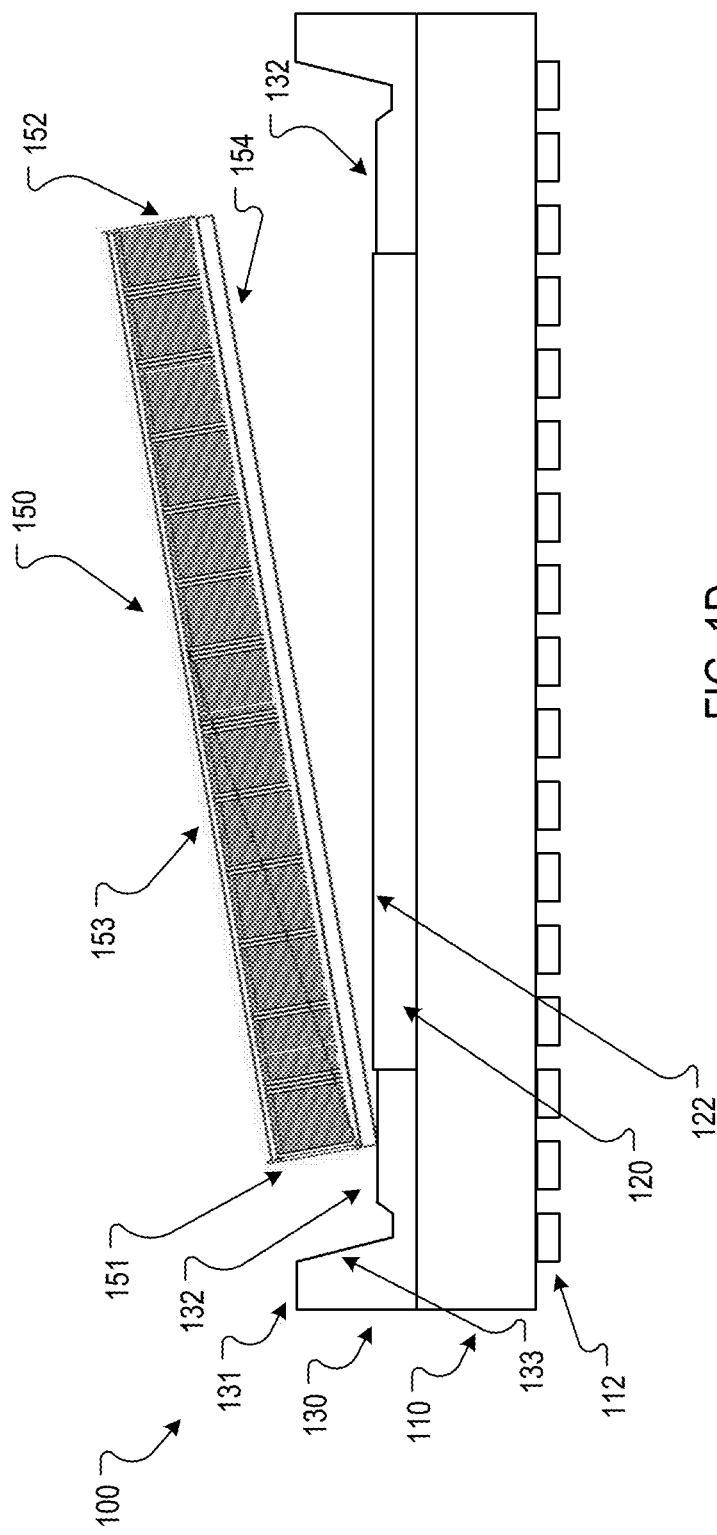
FIG. 1D is a cross-sectional view of the electronic package of FIG. 1A with a heat sink being installed on the electronic package.

FIG. 1D is a cross-sectional view of the electronic package 100 of FIG. 1A with a heat sink 150 being installed on the electronic package 100. The heat sink 150 includes a base 154 (e.g., a copper base) and a fin array 153. In this example, the heat sink 150 is approaching the die 120 at an angle, i.e., the bottom surface of the base 154 of the heat sink 150 is not parallel with the top surface 122 of the die 120. A first side 151 of the heat sink 150 contacts a portion of the second surface 132 of the stiffener 130 before any portion of the heat sink 150 contacts the die 120. After the first side 151 contacts the second surface 132 of the stiffener 130, the second side 152 of the heat sink 150 can continue moving towards the second surface 132 of the stiffener 130 on the other side of the substrate 130 until the base 154 of the heat sink 150 rests flat on the top surface 122 of the die 120. The heat sink 150 can be attached to the electronic package 100 using a mechanical device (e.g., a spring-loaded screw), and adhesive (e.g., a thermal adhesive), or another appropriate attachment technique.

If the heat sink 150 approached the die 120 farther to one side of the electronic package 100, a side of the heat sink 150 may contact the lead-in draft 133. The lead-in draft 133 can guide the side of the heat sink towards the center of the electronic package 100. In this example, the side of the heat sink 150 that contacts the lead-in draft may rest above the recessed groove 134.

FIG. 1E is a cross-sectional view of the electronic package 100 of FIG. 1A with the heat sink 150 installed thereon. The base 154 of the heat sink 150 rests on the top surface 122 of the die 120. In this example, the heat sink 150 is longer than the die 120. Thus, a portion of the heat sink 150 extends over the second surface 132 of the stiffener 130. As the second surface 132 of the stiffener 130 is below the top surface 122 of the die 120, there is a gap between the base 154 of the heat sink 150 and the second surface 132 of the stiffener 130. This gap helps to ensure that the base 154 of the heat sink 150 rests flat on the top surface 122 of the die 120. For example, if the second surface 132 of the stiffener 130 was above the top surface 122 of the die 120, the base 154 of the heat sink 150 would not directly contact the top surface 122 of the die 120 at least in some portions of the top surface 122 of the die 120.

The configuration of the stiffener 130 in the electronic package 100 also provides a wider window in which the heat sink 150 can be installed relative to designs in which the stiffener includes a single thickness. This allows the fin array 153 to be lowered closer to the top surface 122 of the die 120. This also lowers the heat sink thermal resistance by minimizing the thickness of the base 154 of the heatsink, which allows for higher heat flux (watts/square mm) from the die 120.

Figure 2:
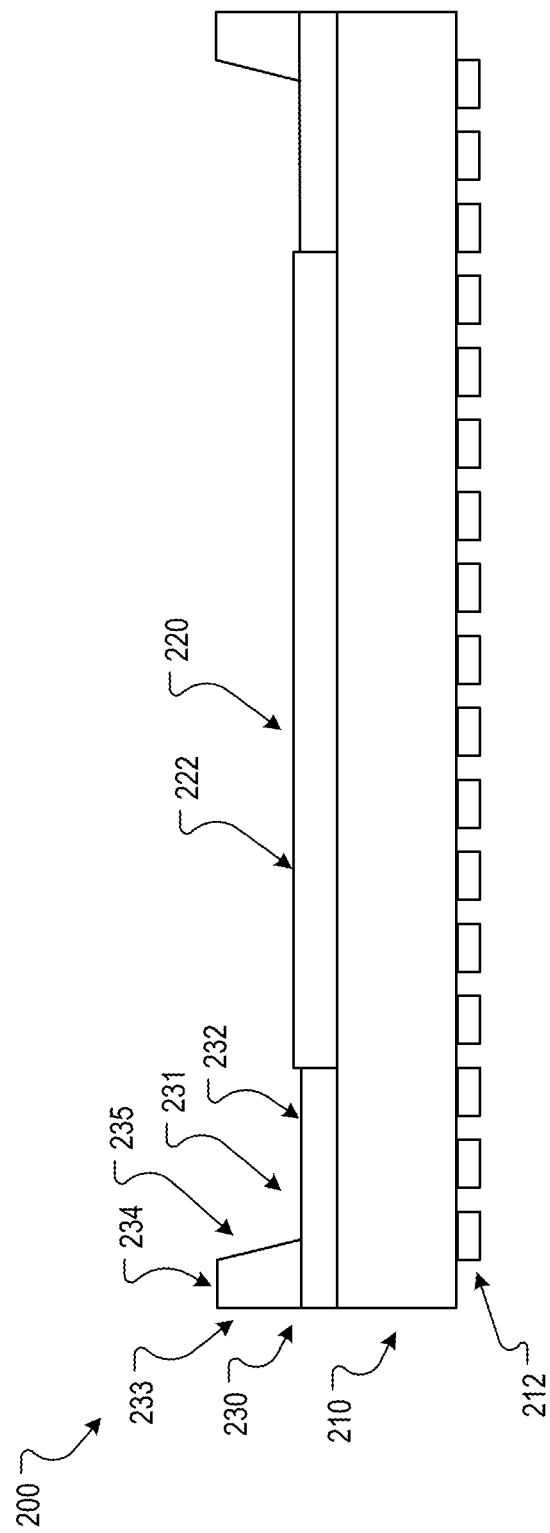
FIG. 2 is a cross-sectional view of another example electronic package.

FIG. 2 is a cross-sectional view of another example electronic package 200. The example electronic package 200 includes a substrate 210 and a die 120 disposed on (e.g., attached to) a surface 211 of the substrate 210. Although one die 220 is illustrated in FIG. 2, multiple die can be disposed on the surface 211 of the substrate 210. The electronic package 200 also includes interconnection pins for attaching the electronic package 210 to a mounting surface, e.g., to a printed circuit board.

The electronic package 200 also includes a stiffener 230 disposed on (e.g., attached to) the surface 211 of the substrate 210. Similar to the stiffener 130 of FIGS. 1A-1E, the stiffener 230 can be made of a material that has a higher elastic modulus than the elastic modulus of the substrate 210.

In this example, the stiffener 230 is made of two stiffeners 231 and 233. The stiffener 231 is disposed on the surface 211 of the substrate 210 and can enclose at least a portion of the outside perimeter of the die 220, similar to the stiffener 130 of FIGS. 1A-1E. The stiffener 231 has a surface 232, e.g., a flat surface, that is below the top surface 222 of the die 220. That is, the surface 232 of the stiffener 232 is a shorter distance from the surface 211 of the substrate 210 than the distance between the top surface 222 of the die 220 and the surface 211 of the substrate 210. The surface 232 of the stiffener 231 provides a landing shelf for a heat sink, similar to the second surface 132 of the stiffener 130 of FIGS. 1A-1E.

The stiffener 233 can be disposed on (e.g., attached to) the surface 232 of the stiffener 231. The stiffener has a surface 234. The stiffener 233 provides additional protection against warping of the electronic package 230. For example, the combination of the size of the stiffener 231 and the size of the stiffener 233 provide better protection against warping than the stiffener 231 alone.

The stiffener 233 can be disposed along the entire perimeter of the stiffener 231 and enclose at least a portion of the die 220. For example, the stiffener 233 can be disposed on an outside edge of the stiffener 231, as shown in FIG. 2. The stiffener 233 can cover the outside edge of the stiffener 231 on each side of the substrate 210. For example, if the substrate is rectangular-shaped like the substrate 110 of FIGS. 1A-1E, the stiffener 231 can run along all four sides and the stiffener 233 can be disposed on the stiffener 231 on all four sides.

The stiffener 233 can include a lead-in draft 235 that is sloped similar to the lead-in draft 133 of FIGS. 1A-1E. Although not shown, the stiffener 231 can include a recessed groove similar to the recessed groove 134 of FIGS. 1A-1E. For example, the stiffener 231 can include a recessed groove where the lead-in draft 235 contacts the surface 232 of the stiffener 231.

Implementations of the subject matter and the operations described in this specification can be implemented in digital electronic circuitry, or in computer software, firmware, or hardware, including the structures disclosed in this specification and their structural equivalents, or in combinations of one or more of them.

While this specification contains many specific implementation details, these should not be construed as limitations on the scope of any inventions or of what may be claimed, but rather as descriptions of features specific to particular implementations of particular inventions. Certain features that are described in this specification in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:
1. A lidless electronic package, comprising:
a substrate having a surface that includes an area on the surface for receiving a die;
a stiffener disposed on the surface of the substrate and that encloses at least a portion of the area on the surface for receiving the die, the stiffener including:

a first surface that is a first distance from the surface of the substrate;

a second surface that is disposed between the area on the surface for receiving the die and the first surface, the second surface being a second distance from the surface of the substrate, wherein the second distance is less than the first distance; and a sloped surface that extends from the first surface to the second surface, the sloped surface being at a greater than ninety-degree angle with respect to a portion of the second surface between the sloped surface and the area on the surface for receiving the die.

2. The lidless electronic package of claim 1, further comprising a die disposed on the surface of the substrate and in the area of the surface for receiving the die, the die having an outside perimeter, a bottom surface adjacent to the surface of the substrate, and a top surface opposite the bottom surface.

3. The lidless electronic package of claim 2, wherein:
the first distance is greater than a distance between the surface of the substrate and the top surface of the die; and
the second distance is less than the distance between the surface of the substrate and the top surface of the die.

4. The lidless electronic package of claim 2, wherein:
the first surface and the second surface are substantially parallel with the surface of the substrate; and
the first surface is above the top surface of the die and the second surface is below the top surface of the die.

5. The lidless electronic package of claim 1, further comprising multiple die disposed on the surface of the substrate and in the area of the surface for receiving the die.

6. The lidless electronic package of claim 1, wherein the first surface and the second surface are part of a single stiffener that has a varying thickness, wherein a thickness of the stiffener below the first surface is greater than a thickness of the stiffener below the second surface.

7. A lidless electronic package, comprising:
a substrate having a surface that includes an area on the surface for receiving a die;
a stiffener disposed on the surface of the substrate and that encloses at least a portion of the area on the surface for receiving the die, the stiffener including:
a first surface that is a first distance from the surface of the substrate;
a second surface that is disposed between the area on the surface for receiving the die and the first surface, the second surface being a second distance from the surface of the substrate, wherein the second distance is less than the first distance; and
a recessed groove between the first surface and the second surface, the recessed groove including a third surface that is closer to the surface of the substrate than the second surface.

8. An electronic package, comprising:
a substrate having a surface that includes an area on the surface for receiving one or more die;
a stiffener disposed on the surface of the substrate and that surrounds at least a portion of a perimeter of the area on the surface for receiving the one or more die, the stiffener including:
a first portion having a first surface and a first thickness extending between the surface of the substrate and the first surface;
a second portion having (i) a second surface that is disposed between the area on the surface for receiving the die and the first surface and (ii) a second thickness extending between the surface of the substrate and the second surface, the second thickness being less than the first thickness; and
a sloped surface that extends from the first surface to the second surface, the sloped surface being at a greater than ninety-degree angle with respect to a portion of the second surface between the sloped surface and the area on the surface of the substrate for receiving the one or more die.

9. The electronic package of claim 8, further comprising at least one die disposed on the surface of the substrate, the at least one die having an outside perimeter, a bottom surface adjacent to the surface of the substrate, and a top surface opposite the bottom surface.

10. The electronic package of claim 9, wherein:
the first thickness is greater than a thickness of the at least one die that extends from the bottom surface of the at least one die to the top surface of the die; and
the second thickness is less than the thickness of the at least one die.

11. The electronic package of claim 9, wherein the first surface is above the top surface of the die and the second surface is below the top surface of the die.

12. The electronic package of claim 8, wherein the first surface and the second surface are substantially parallel with the surface of the substrate.

13. An electronic package, comprising:
a substrate having a surface that includes an area on the surface for receiving one or more die;
a stiffener disposed on the surface of the substrate and that surrounds at least a portion of a perimeter of the area on the surface for receiving the one or more die, the stiffener including:
a first portion having a first surface and a first thickness extending between the surface of the substrate and the first surface;
a second portion having (i) a second surface that is disposed between the area on the surface for receiving the die and the first surface and (ii) a second thickness extending between the surface of the substrate and the second surface, the second thickness being less than the first thickness; and
a recessed groove between the first surface and the second surface, the recessed groove including a third surface that is closer to the surface of the substrate than the second surface.

14. A lidless electronic package, comprising:
a substrate having a surface that includes an area on the surface for receiving one or more die;
a stiffener disposed on the surface of the substrate and that encloses at least a portion of the outside perimeter of the area on the surface for receiving the one or more die, the stiffener including:
a first surface that is substantially parallel with the surface of the substrate and that is located along an exterior perimeter of the stiffener;
a second surface that is disposed between the area on the surface for receiving the one or more die and the first surface, the second surface being closer to the surface of the substrate than the first surface, the second surface being substantially parallel with the surface of the substrate; and
a sloped surface that extends from the first surface to the second surface, the sloped surface being at a greater than ninety-degree angle with respect to a portion of the second surface between the sloped surface and the area on the surface of the substrate for receiving the one or more die.

15. The lidless electronic package of claim 14, further comprising at least one die attached to the surface of the substrate, the die having an outside perimeter, a bottom surface adjacent to the surface of the substrate, and a top surface opposite the bottom surface.

16. The lidless electronic package of claim 15, wherein the first surface is above the top surface of the at least one die and the second surface is below the top surface of the at least one die.

17. The lidless electronic package of claim 14, wherein the stiffener comprises a sloped surface that extends from the first surface to the second surface, the sloped surface being at a less than ninety-degree angle with respect to the second surface.

18. The lidless electronic package of claim 14, wherein the stiffener comprises a recessed groove between the first surface and the second surface, the recessed groove including a third surface that is closer to the surface of the substrate than the second surface.

\* \* \* \* \*